United States Patent [19]
Butter et al.

[11] Patent Number: 5,805,088
[45] Date of Patent: Sep. 8, 1998

[54] HIGH SPEED ASYNCHRONOUS SERIAL TO PARALLEL DATA CONVERTER

[75] Inventors: Adrian Stephen Butter, Binghamton; Leonard Ronald Chieco, Hopewell Junction, both of N.Y.; James Paul Kuruts, Forest City, Pa.; Michael Anthony Sorna, Hopewell Jct, N.Y.

[73] Assignee: International Business Machines Corporation, Armonk, N.Y.

[21] Appl. No.: 740,811

[22] Filed: Nov. 1, 1996

[51] Int. Cl.⁶ ........................................ H03M 9/00
[52] U.S. Cl. ............................................... 341/100
[58] Field of Search ...................... 341/100, 101

[56] References Cited

U.S. PATENT DOCUMENTS

| | | |
|---|---|---|
| 3,936,604 | 2/1976 | Pommerening . |
| 4,015,252 | 3/1977 | Symanski . |
| 4,065,862 | 1/1978 | Meyer . |
| 4,748,588 | 5/1988 | Norman et al. . |
| 4,839,890 | 6/1989 | Semerau et al. . |
| 4,868,514 | 9/1989 | Azevedo et al. . |
| 5,052,029 | 9/1991 | James et al. . |
| 5,208,913 | 5/1993 | Yamamoto . |
| 5,323,426 | 6/1994 | James et al. . |
| 5,381,181 | 1/1995 | Deiss . |
| 5,384,769 | 1/1995 | Opresca et al. . |
| 5,384,789 | 1/1995 | Tomita . |
| 5,392,421 | 2/1995 | Lennartsson . |
| 5,394,556 | 2/1995 | Oprescu . |
| 5,452,436 | 9/1995 | Arai et al. . |

*Primary Examiner*—Brian K. Young
*Attorney, Agent, or Firm*—Arthur J. Samodovitz

[57] ABSTRACT

A device converts serial data based on one clock to parallel data based on a different, asynchronous clock. The data converter comprises one register bank including first and second registers and another register bank including third and fourth registers. A data input of the first register and a data input of the third register are coupled to receive the serial data. A data input of the second register is coupled to a data output of the first register. A data input of the fourth register is coupled to a data output of the third register. A first clock triggers the first and second registers simultaneously and a second clock triggers the third and fourth registers simultaneously. The first and second clocks alternate with each other. Fifth, sixth, seventh and eighth registers have respective data inputs coupled to respective data outputs of the first, second, third and fourth registers. A third clock triggers the fifth and sixth registers simultaneously to latch bits 0 and 2, respectively, of a series of four bits. A fourth clock triggers the seventh and eight registers simultaneously to latch bits 1 and 3, respectively, of the series of four bits.

20 Claims, 7 Drawing Sheets

HIGH SPEED ASYNCHRONOUS SERIAL TO PARALLEL DATA CONVERTER

BACKGROUND OF THE INVENTION

The invention relates generally to electronic communications hardware and deals more particularly with a high speed serial to parallel data converter in which the serial data is asynchronous relative to the parallel data.

There are many applications where data is converted from a serial format based on one clock to a four, eight or sixteen bit parallel format based on a different, asynchronous clock. For example, digital data may be received at a customer's home serially from a satellite or cable in a compressed format and then converted to parallel format for processing by digital decompression hardware. The serial data may be presented at 100–200 Megabits per second. The synchronization and subsequent conversion to parallel format is important to simplify processing within the decompression hardware. The conversion reduces the rate at which the decompression hardware must operate. If there are four bits in the parallel format, the reduction is a factor of four.

It was previously known to supply the serial data to a multiplexor and then control the multiplexor to supply four sequential bits to four separate registers. Register A receives bits 0,4,8, etc., register B receives bits 1,5,9, etc., register C receives bits 2,6,10, etc., and register D receives bits 3,7,11, etc. When the registers contain bits 0–3, 4–7, 8–11, etc. they are read out in parallel. While the multiplexor is effective to distribute the bits, the multiplexor is a relatively slow device. It is not believed that currently available multiplexors can multiplex serial data received at 200 Megabits per second.

Accordingly, a general object of the present invention is to provide a serial to parallel data converter for high serial data rates in which the serial data is based on one clock and the parallel data is based on a different, asynchronous clock.

SUMMARY OF THE INVENTION

The invention resides in a device for converting serial data based on one clock to parallel data based on a different, asynchronous clock. The invention operates at high bit rates such as found in compressed digital video transmitted by a satellite or cable. The data converter comprises one register bank including first and second registers and another register bank including third and fourth registers. A data input of the first register and a data input of the third register are coupled to receive the serial data. A data input of the second register is coupled to a data output of the first register. A data input of the fourth register is coupled to a data output of the third register. A first clock triggers the first and second registers simultaneously and a second clock triggers the third and fourth registers simultaneously. The first and second clocks alternate with each other. Fifth, sixth, seventh and eighth registers have respective data inputs coupled to respective data outputs of the first, second, third and fourth registers. A third clock triggers the fifth and sixth registers simultaneously to latch bits 0 and 2, respectively, of a series of four bits. A fourth clock triggers the seventh and eight registers simultaneously to latch bits 1 and 3, respectively, of the series of four bits. The first and second clocks are synchronous with each other. The third and fourth clocks are synchronous with each other and asynchronous with the first and second clock. A ninth four bit register receives outputs of the fifth, sixth, seventh and eighth registers to form four parallel data outputs corresponding to the series of four bits. The parallel outputs are synchronous with the third and fourth clocks and available for other processing, such as decompression.

The invention is expandable with register banks twice in number to yield eight parallel output bits and twice the serial bit rate, and is expandable with register banks four times in number to yield sixteen parallel output bits and four times the serial bit rate.

DETAILED DESCRIPTION OF THE PREFERRED EMBODIMENTS

Figure 1:
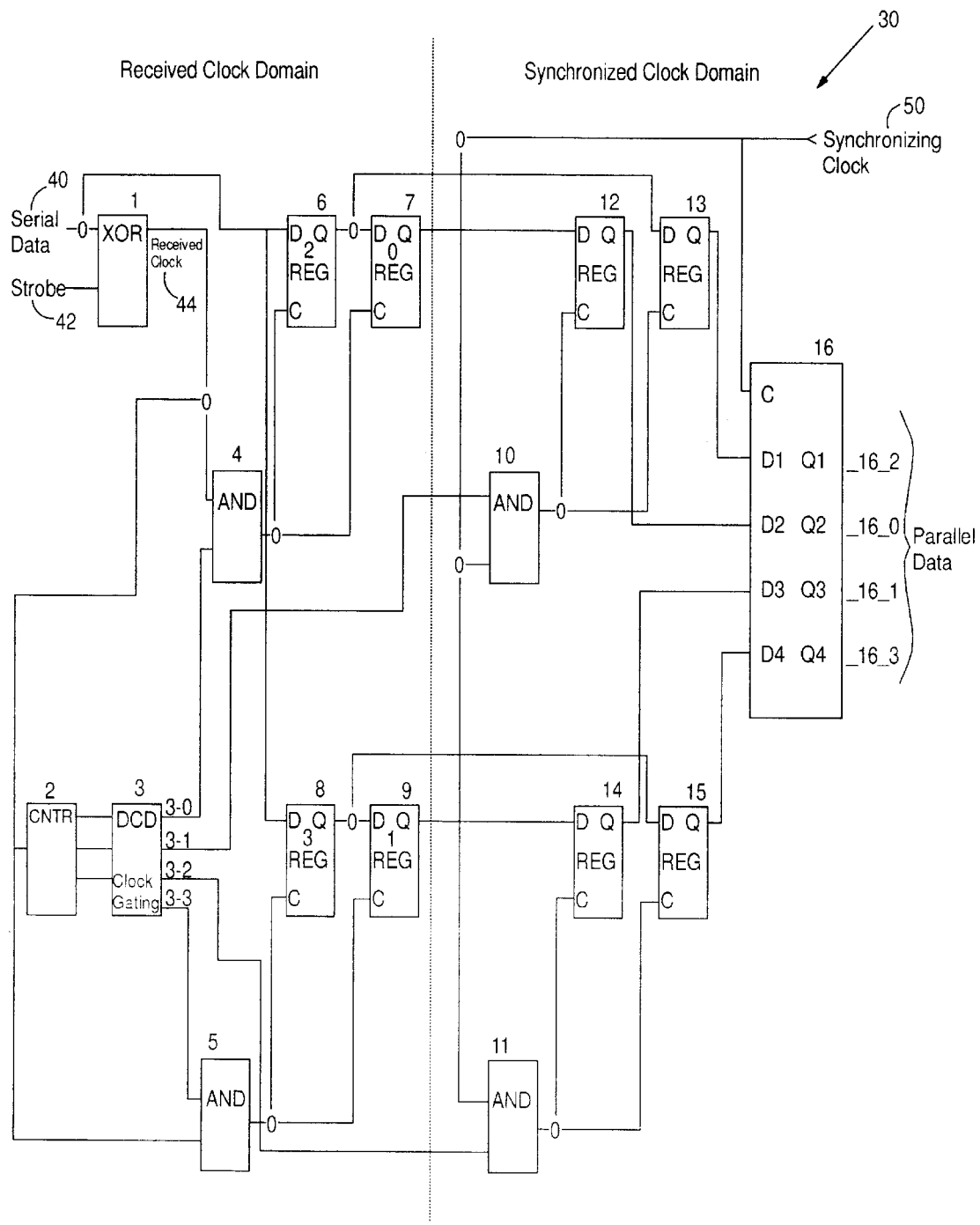
FIG. 1 is a logic diagram of a high speed asynchronous serial to parallel data converter according to the present invention.
Figure 2:
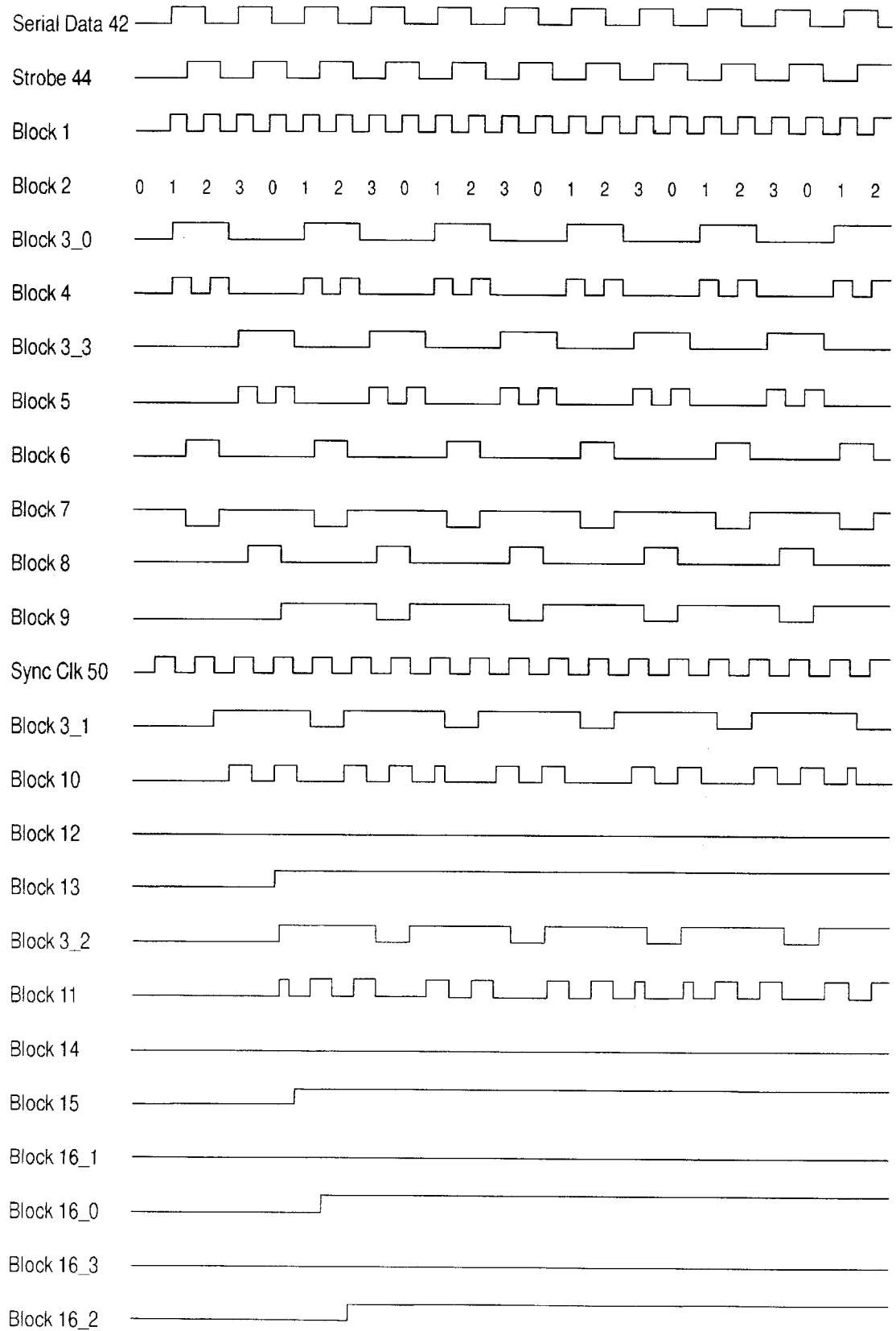
FIG. 2 is a timing diagram for the logic diagram of FIG. 1.

Referring now to the drawings in detail wherein like reference numbers indicate like elements throughout, FIG. 1 illustrates a high speed asynchronous serial to parallel data converter generally designated 30 according to the present invention. Serial data 40 is received at an input to an Exclusive Or block 1. The other input is supplied by a Strobe signal 42. According to a standard defined by IEEE High Performance Serial Bus Specification 1394, one but not both of the serial data or the strobe signal must change every data interval. The timing diagram of FIG. 2 illustrates a case where the serial data pattern is 1,0,1,0 etc and the strobe signal is 0,1,0,1 etc. In the illustrated example, the serial data 40 was encoded before transmission to converter 30. The encoding technique is that described in U.S. Pat. No. 5,327,127 to Bristol et al. and UK Patent 9011700.3, which patents are hereby incorporated by reference as part of the present disclosure. The output of Exclusive Or block 1 provides a received clock signal 44.

Figure 3:
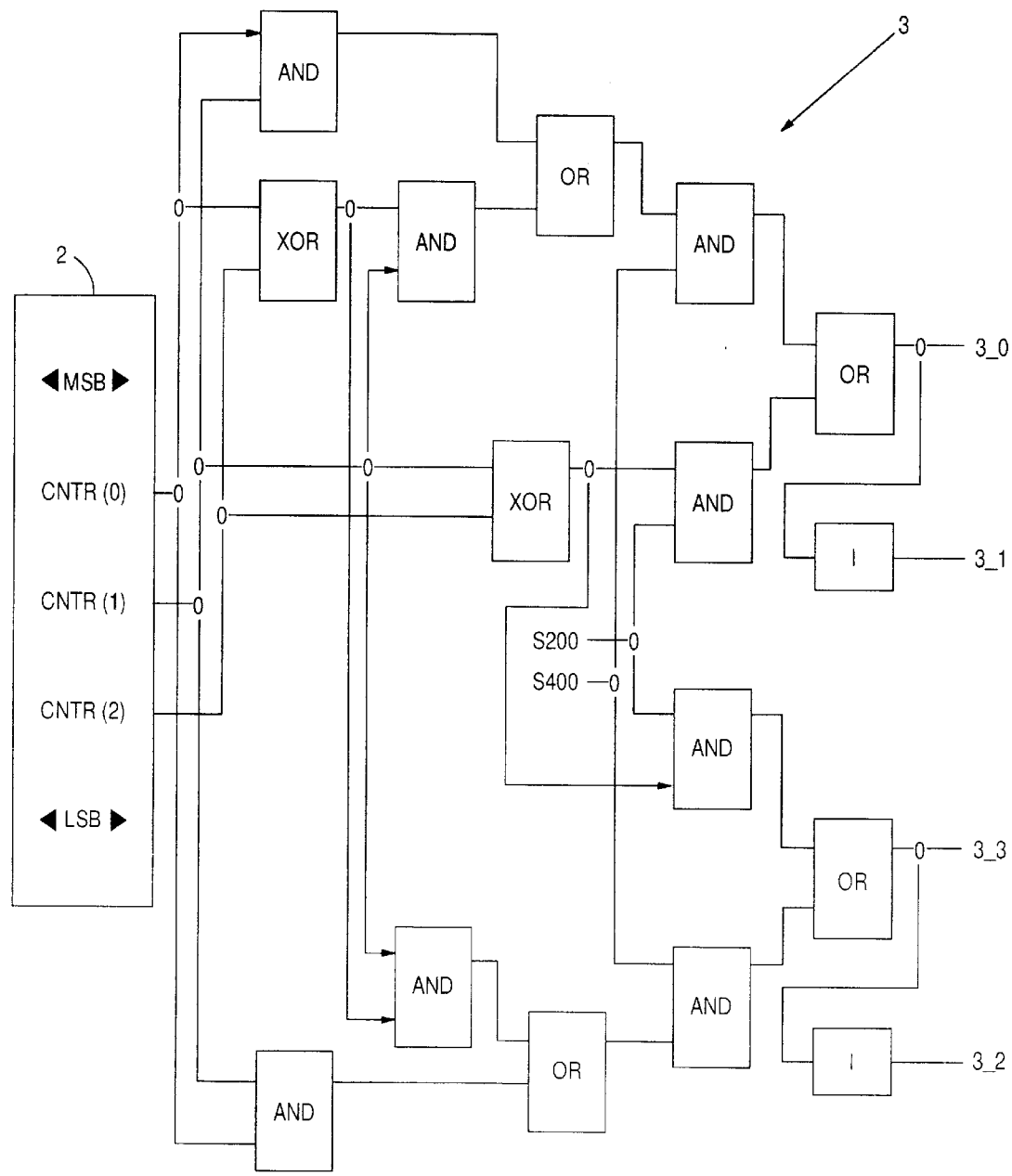
FIG. 3 is a logic diagram of a decoder block within the data converter of FIG. 1.

Converter 30 includes a first bank of two registers 6 and 7 and a second bank of two registers 8 and 9. In the preferred embodiment, each register is a one bit D-Flip Flop and is edge triggered. The serial data 40 (received from a satellite, cable or other communication channel) is also supplied to data inputs of register blocks 6 and 8. The received clock signal 44 is also supplied to a counter block 2 which counts cycles of the received clock signal 44, and wraps after each four cycles. The output of counter block 2 supplies the count to a decoder block 3 which yields clock gating signals 3_0, 3_1, 3_2 and 3_3 as indicated by the timing diagram of FIG. 2 and the logic diagram of FIG. 3. For a 200 Megabits/second serial bit stream, the S200 line is tied to a logic one and the S400 line is tied to a logic zero. Clock gating signal 3_0 is supplied to an AND block 4 which gates the received clock signal 44 simultaneously to register blocks 6 and 7. The output of register block 6 is supplied to the data input of register block 7. Each odd data bit of the serial data is first clocked into register block 6 by the received clock signal 3_0 and, on the next iteration of the received clock signal 3_0, this bit is clocked into register block 7 while the current odd bit is clocked into register block 6. Thus, each data bit written into register block 6 is held in register block 6 for four periods of the received clock signal 44 and then held in register block 7 for the next four periods of the clock signal.

Clock gating signal 3_3 is supplied to an AND block 5 which gates the received clock signal 3_3 simultaneously to register blocks 8 and 9. The output of register block 8 is supplied to the data input of register block 9. Each even data bit of the serial data is first clocked into register block 8 by the received clock signal 3_3 and, on the next iteration of the received clock signal 3_3, this bit is clocked into register block 9 while the current even bit is clocked into register block 8. Thus, each data bit written into register block 8 is held in register block 8 for four periods of the received clock signal 44 and then held in register block 9 for the next four periods of the clock signal.

Converter 30 also includes a third bank of registers 12 and 13 and a fourth bank of registers 14 and 15. In the preferred embodiment, each of the registers 12–15 is a D-Flip Flop and is edge triggered. Clock gating signal 3_1 is supplied to AND block 10 which gates a synchronizing clock signal 50 to register blocks 12 and 13. Upon each occurrence of the clock gating signal 3_1, the data bit in register 6 is clocked into register 13 and simultaneously, the data bit in register 7 is clocked into register 12. Clock gating signal 3_2 is supplied to AND block 11 which gates the synchronizing clock signal 50 to register blocks 14 and 15. Upon each occurrence of the clock gating signal 3_2, the data bit in register 8 is clocked into register 15 and simultaneously, the data bit in register 9 is clocked into register 14.

Converter 30 also includes a four input latch 16, which in the preferred embodiment, comprises four edge triggered D-Flip Flops with a common clock control. The four inputs are coupled to the outputs of registers 12–15. The synchronizing clock signal 50 provides the clock control to latch 16 in a free running manner, i.e. there is no gating between the synchronizing clock signal 50 and the clock control for latch 16. The output of latch 16 is the four bit synchronous parallel data.

Converter 30 uses the following technique to synchronize timing in view of the following situation. The serial data 40 is received using the received clock signal 44 which is derived from the serial data 40 and the received strobe signal 42. However, the parallel data output is processed using synchronized clock signal 50 which is generated within converter 30. The frequency of synchronizing clock signal 50 is approximately equal to the frequency of the received clock signal 44 but the data is held in registers 6–9 for four periods of the received clock signal 44. Therefore, there are at least two periods of the synchronizing clock signal 50 available to sample each data bit from registers 6–9 into registers 12–15.

Figure 4:
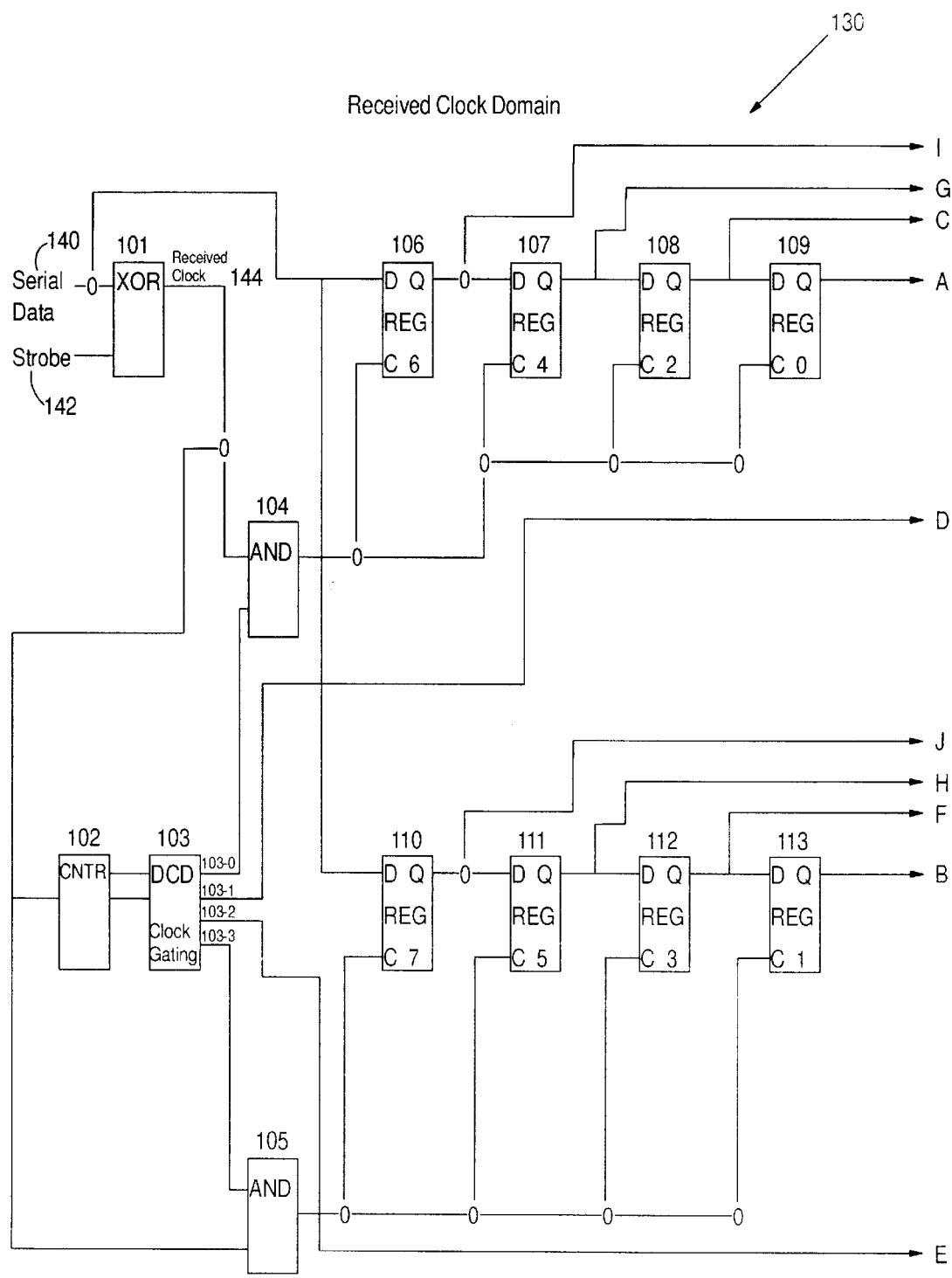
FIGS. 4(a,b) form a logic diagram of another high speed asynchronous serial to parallel data converter according to the present invention.
Figure 4:
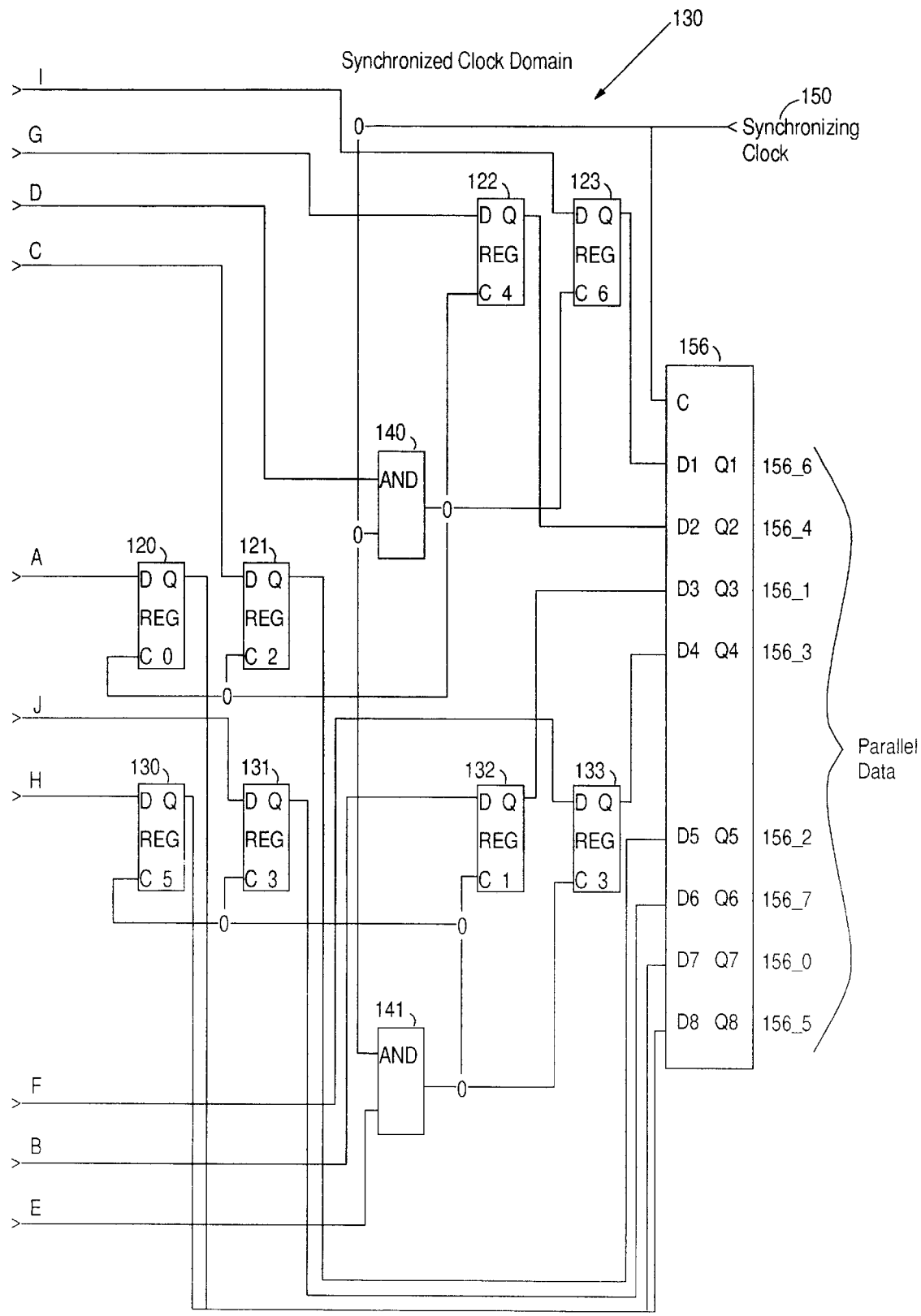
Figure 5:
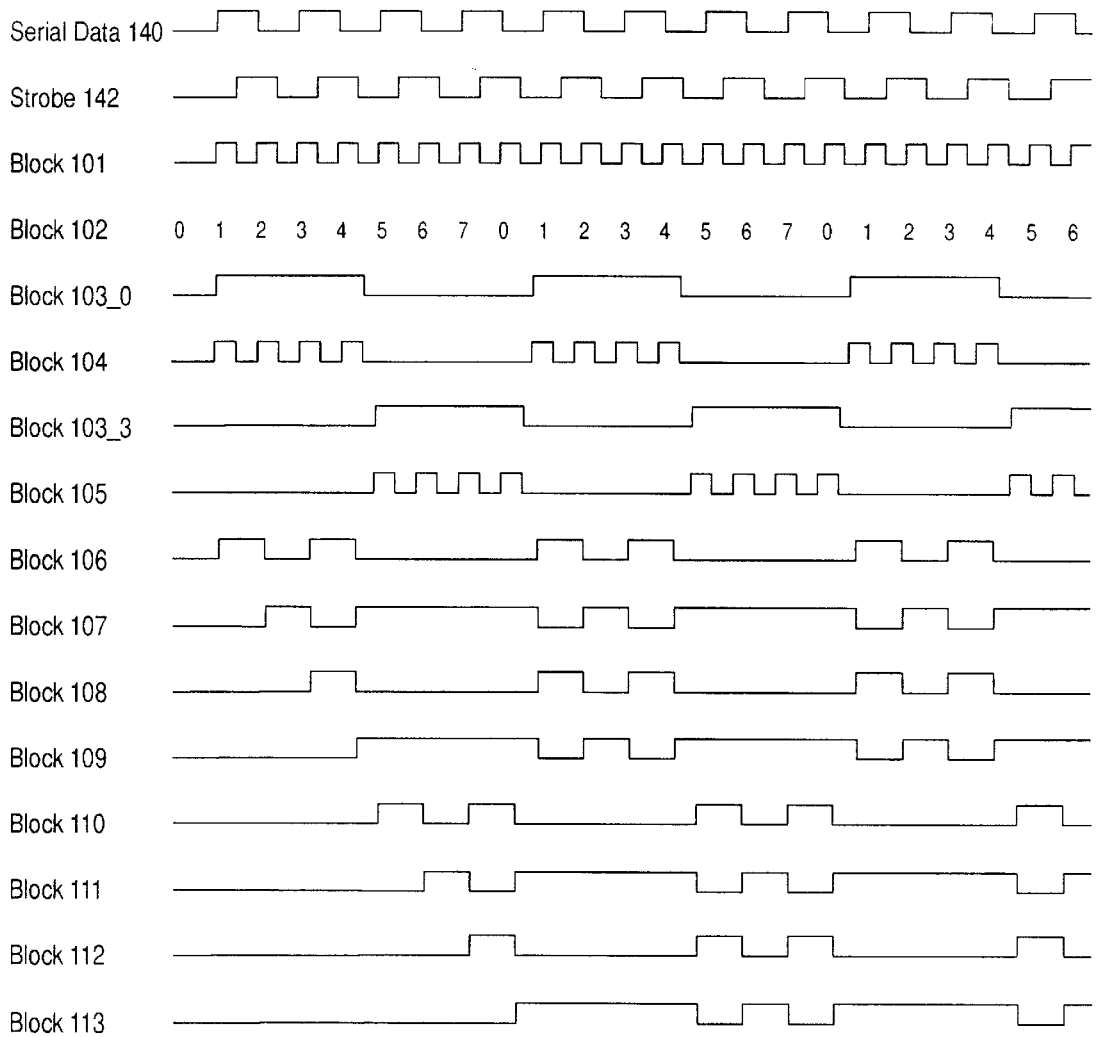
FIGS. 5(a,b) form a timing diagram for the logic diagram of FIG. 4.
Figure 5:
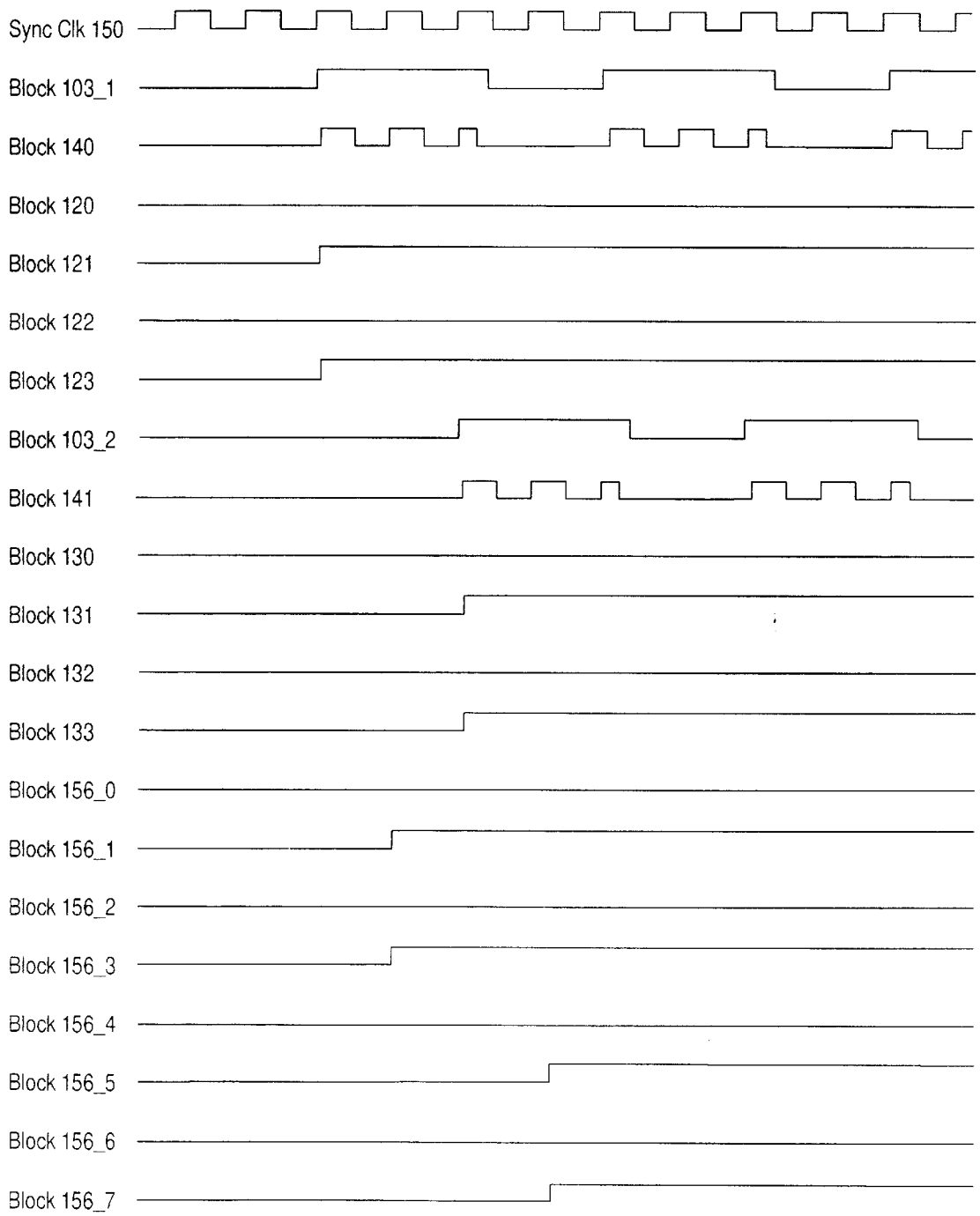

FIGS. 4(a,b) illustrate another high speed asynchronous serial to parallel data converter generally designated 130 according to the present invention. As explained in more detail below, converter is designed for twice the serial data bit rate as converter 30. Serial data 140 is received at an input to an Exclusive Or block 101. The other input is supplied by Strobe signal 142. According to a standard defined by IEEE High Performance Serial Bus Specification 1394, one but not both of the serial data or the strobe signal must change every data interval. The timing diagram of FIGS. 5(a,b) illustrates a case where the serial data pattern is 1,0,1,0 etc and the strobe signal is 0,1,0,1 etc. In the illustrated example, the serial data 140 was encoded before transmission to converter 130. The encoding technique is also that described in U.S. Pat. No. 5,341,371 to Robert Simpson and UK Patent 9011700.3. The output of Exclusive Or block 101 provides received clock signal 144.

Converter 130 includes a first bank of four registers 106, 107, 108 and 109 and a second bank of two registers 110, 111, 112 and 113. In the preferred embodiment, each register is a one bit D-Flip Flop and is edge triggered. The serial data 140 (received from a satellite, cable or other communication channel) is also supplied to data inputs of register blocks 106 and 110. The received clock signal 144 is also supplied to a counter block 102 which counts cycles of the received clock signal 144, and wraps after each four cycles. The output of counter block 102 supplies the count to a decoder block 103 which yields clock gating signals 103_0, 103_1, 103_2 and 103_3 as indicated by the timing diagram of FIGS. 5(a,b). Decoder 103 is the same as decoder 3 illustrated in FIG. 3 except for a 400 Megabits/second serial bit stream, the S400 line is tied to a logic one and the S200 line is tied to a logic zero. Clock gating signal 103_0 is supplied to an AND block 104 which gates the received clock signal 144 simultaneously to register blocks 106 and 110. The output of register block 106 is supplied to the data input of register block 107, the output of register 107 is supplied to the data input of register 108 and the output of register 108 is supplied to the data input of register 109. The even bits propagate sequentially through registers 106, 107, 108 and 109 in this order based on sequential clock gating signals 103_0.

Clock gating signal 103_3 is supplied to an AND block 105 which gates the received clock signal 103_3 simultaneously to register blocks 110–113. The output of register block 110 is supplied to the data input of register block 111, the output of register block 111 is supplied to the input of register block 112 and the output of register block 112 is supplied to the input of register block 113. The odd bits propagate sequentially through registers 110, 111, 112 and 113 in this order based on sequential clock gating signals 103_3. Because the each bank of converter 130 includes four registers instead of two register of converter 30, converter 130 is capable of twice the bit rate as converter 30.

Converter 130 also includes a third bank of registers 120, 121, 122 and 123 and a fourth bank of registers 130, 131, 132 and 133. In the preferred embodiment, each of the registers 120–123 and 130–133 is a D-Flip Flop and is edge triggered. Clock gating signal 103_1 is supplied to AND block 140 which gates a synchronizing clock signal 150 to register blocks 120–123. Upon each occurrence of the clock gating signal 103_1, the data bit in register 106 is clocked into register 120 and simultaneously, the data bit in register 107 is clocked into register 121, the data bit in register 108 is clocked into register 122 and the data bit in register 109 is clocked into register 123. Clock gating signal 103_2 is supplied to AND block 141 which gates the synchronizing clock signal 150 to register blocks 130–133. Upon each occurrence of the clock gating signal 103_2, the data bit in register 110 is clocked into register 130 and simultaneously, the data bit in register 111 is clocked into register 131, the data bit in register 112 is clocked into register 132 and the data bit in register 113 is clocked into register 133.

Converter 130 also includes an eight input latch 156, which in the preferred embodiment, comprises eight edge triggered D-Flip Flops with a common clock control. The eight inputs are coupled to the outputs of registers 120–123 and 131–133. The synchronizing clock signal 150 provides the clock control to latch 156 in a free running manner, i.e. there is no gating between the synchronizing clock signal 150 and the clock control for latch 156. The output of latch 156 is the eight bit synchronous parallel data.

Converter 130 uses the following technique to synchronize timing in view of the following situation. The serial data 140 is received using the received clock signal 144 which is derived from the serial data 140 and the received strobe signal 142. However, the parallel data output is processed using synchronized clock signal 150 which is generated within converter 130. The frequency of synchronizing clock signal 150 is approximately 90% of the frequency of the received clock signal 144 but the data is held in registers 106–109 and 110–113 for four periods of the received clock signal 144. Therefore, there are at least two periods of the synchronizing clock signal 150 available to sample each data bit from registers 106–109 and 110–113 into registers 120–123 and 130–133, respectively.

Converters 30 and 130 can be used in conjunction with hardware for detecting the beginning and end of the serial data 40. Suitable hardware is disclosed in U.S. Pat. application Ser. No. 08/740,810 entitled Apparatus and Method For Detecting End of Bit Stream filed Nov. 1, 1996 by James Kuruts and Adrian Butter, which patent application is hereby incorporated by reference as part of the present disclosure.

Based on the foregoing, serial to parallel data converters have been disclosed according to the present invention. However, numerous modifications and substitutions can be made without deviating from the scope of the present invention. Therefore, the present invention has been disclosed by way of illustration and not limitation and reference should be made to the following claims to determine the scope of the present invention.

We claim:

1. A serial to parallel data converter comprising:
   first, second, third and fourth registers, a data input of said second register being coupled to a data output of said first register, a data input of said fourth register being coupled to a data output of said third register, a data input of said first register and a data input of said third register being coupled to receive serial data;
   first means for clocking said first and second registers simultaneously;
   second means for clocking said third and fourth registers simultaneously, the first and second clocking means alternating with each other;
   fifth, sixth, seventh and eighth registers having respective data inputs coupled to respective data outputs of said first, second, third and fourth registers;
   third means for clocking said fifth and sixth registers simultaneously to latch bits 0 and 2, respectively, of a series of four bits; and
   fourth means for clocking said seventh and eight registers simultaneously to latch bits 1 and 3, respectively, of said series of four bits.

2. A data converter as set forth in claim 1 wherein the third and fourth clocking means alternate with each other.

3. A data converter as set forth in claim 1 further comprising a ninth four bit register for receiving outputs of said fifth, sixth, seventh and eighth registers to form four parallel data outputs corresponding to said series of four bits, said ninth register being clocked synchronously with said third and fourth clocks.

4. A data converter as set forth in claim 1 wherein said first and second clocking means are synchronous with each other and said third and fourth clocking means are synchronous with each other and asynchronous with said first and second clocking means.

5. A data converter as set forth in claim 4 wherein the data bits latched in said first, second, third and fourth registers are held there long enough for said third and fourth clocking means to reliable clock them into said fifth, sixth, seventh and eighth registers, respectively.

6. A data converter as set forth in claim 1 wherein said first and second clocking means are based on a clock signal derived from the received serial data and a received strobe signal.

7. A data converter as set forth in claim 6 wherein said third and fourth clocking means are based on said derived clock signal and a clock signal generated by said data converter, and said first and second clocking means are not based on said generated clock signal and are asynchronous relative to said third and fourth clocking means.

8. A data converter as set forth in claim 6 wherein said third and fourth clocking means are based on said derived clock signal and a clock signal generated by said data converter, said generated clock signal being asynchronous relative to said derived clock signal.

9. A data converter as set forth in claim 7 wherein said second and third further comprising means for receiving said serial data and a strobe signal in accordance with IEEE High Performance Serial Bus Specification 1394.

10. A data converter as set forth in claim 1 wherein said third and fourth clocking means are based on a clock signal generated by said data converter, said generated clock signal being asynchronous relative to said derived clock signal.

11. A serial to parallel data converter comprising:
   a first register coupled to receive serial data, a second register coupled to receive an output of said first register, a third register coupled to receive an output of said second register and a fourth register coupled to receive an output of said third register;
   a fifth register coupled to receive said serial data, a sixth register coupled to receive an output of said fifth register, a seventh register coupled to receive an output of said sixth register and an eighth register coupled to receive an output of said seventh register;
   first means for clocking said first, second, third and fourth registers simultaneously;
   second means for clocking said fifth, sixth, seventh and eighth registers simultaneously, the first and second clocking means alternating with each other;
   ninth, tenth, eleventh, twelfth registers, thirteenth, fourteenth, fifteenth and sixteenth, having respective data inputs coupled to respective data outputs of said first, second, third, fourth, fifth, sixth, seventh and eighth registers;
   third means for clocking said ninth, tenth, eleventh and twelfth registers simultaneously to latch bits 0, 2, 4 and 6 respectively, of a series of eight bits; and
   fourth means for clocking said thirteenth, fourteenth, fifteenth and sixteenth registers simultaneously to latch bits 1, 3, 5 and 7 respectively, of said series of eighth bits.

12. A data converter as set forth in claim 11 wherein the third and fourth clocking means alternate with each other.

13. A data converter as set forth in claim 11 further comprising a seventeenth eight bit register for receiving outputs of said ninth, tenth, eleventh, twelfth, thirteenth, fourteenth, fifteenth and sixteenth registers to form eight parallel data outputs corresponding to said series of eight bits, said seventeenth register being clocked synchronously with said third and fourth clocks.

14. A data converter as set forth in claim 11 wherein said first and second clocking means are synchronous with each other and said third and fourth clocking means are synchronous with each other and asynchronous with said first and second clocking means.

15. A data converter as set forth in claim 14 wherein the data bits latched in said first, second, third, fourth, fifth, sixth, seventh and eighth registers are held there long enough for said third and fourth clocking means to reliable clock them into said ninth, tenth, eleventh, twelfth, thirteenth, fourteenth, fifteenth and sixteenth registers, respectively.

16. A data converter as set forth in claim 11 wherein said first and second clocking means are based on a clock signal derived from the received serial data and a received strobe signal.

17. A data converter as set forth in claim 16 wherein said third and fourth clocking means are based on said derived clock signal and a clock signal generated by said data converter, and said first and second clocking means are not based on said generated clock signal and are asynchronous relative to said third and fourth clocking means.

18. A data converter as set forth in claim 16 wherein said third and fourth clocking means are based on said derived clock signal and a clock signal generated by said data converter, said generated clock signal being asynchronous relative to said derived clock signal.

19. A data converter as set forth in claim 17 wherein said second and third further comprising means for receiving said serial data and a strobe signal in accordance with IEEE High Performance Serial Bus Specification 1394.

20. A data converter as set forth in claim 11 wherein said third and fourth clocking means are based on a clock signal generated by said data converter, said generated clock signal being asynchronous relative to said derived clock signal.

* * * * *